(12) United States Patent
Popescu et al.

(10) Patent No.: US 7,529,329 B2
(45) Date of Patent: May 5, 2009

(54) CIRCUIT FOR ADAPTIVE SAMPLING EDGE POSITION CONTROL AND A METHOD THEREFOR

(75) Inventors: Petre Popescu, Ottawa (CA); Douglas Stuart McPherson, Ottawa (CA); Hai Tran Quoc, Ottawa (CA); Stanislas Wolski, Montreal (CA)

(73) Assignee: Applied Micro Circuits Corporation, San Diego, CA (US)

( * ) Notice: Subject to any disclaimer, the term of this patent is extended or adjusted under 35 U.S.C. 154(b) by 901 days.

(21) Appl. No.: 10/984,231

(22) Filed: Nov. 8, 2004

(65) Prior Publication Data

US 2006/0034394 A1 Feb. 16, 2006

Related U.S. Application Data

(60) Provisional application No. 60/599,946, filed on Aug. 10, 2004.

(51) Int. Cl.
*H04L 7/00* (2006.01)
(52) U.S. Cl. ............... 375/354; 375/355; 375/326; 375/373; 327/147
(58) Field of Classification Search ............... 375/327, 375/354
See application file for complete search history.

(56) References Cited

U.S. PATENT DOCUMENTS

| | | | | |
|---|---|---|---|---|
| 4,291,332 A | * | 9/1981 | Kato et al. | 348/539 |
| 4,797,730 A | * | 1/1989 | Smith | 348/539 |
| 5,999,577 A | * | 12/1999 | Kawai | 375/334 |
| 6,177,843 B1 | * | 1/2001 | Chou et al. | 331/25 |
| 6,262,611 B1 | * | 7/2001 | Takeuchi | 327/159 |
| 6,864,709 B2 | * | 3/2005 | Fowler | 326/38 |
| 7,057,435 B2 | * | 6/2006 | Mahanavelu et al. | 327/261 |
| 7,092,449 B2 | * | 8/2006 | Segaram | 375/257 |
| 2002/0085656 A1 | * | 7/2002 | Lee et al. | 375/355 |
| 2003/0011847 A1 | | 1/2003 | Dai et al. | |
| 2004/0037572 A1 | | 2/2004 | Matsuyama | |

OTHER PUBLICATIONS

David Johns and Ken Martin, "Analog Integrated Circuit Design", John Wiley&Sons, 1997, p. 648-649.

* cited by examiner

*Primary Examiner*—Shuwang Liu
*Assistant Examiner*—Lihong Yu
(74) *Attorney, Agent, or Firm*—Law Office of Gerald Maliszewski; Gerald Maliszewski

(57) ABSTRACT

A clock and data recovery circuit (CDR) for receiving high-speed digital data, and having an analog phase offset control capability, is improved by providing an adaptive sampling edge position control. A differential circuit samples the raw data signal at three closely spaced sampling points of the eye, and compares advanced and delayed sampled data with the nominal sampled data. If either the advanced or delayed sampled data differ from the nominal sampled data, i.e. if advanced or delayed errors are detected, a shift in the sampling edge position may be required. A logic circuit performs a method determining the occurrence of advanced or delayed errors over progressively longer time intervals, and to adjust the sampling edge position of the CDR by controlling the phase offset.

7 Claims, 10 Drawing Sheets

CIRCUIT FOR ADAPTIVE SAMPLING EDGE POSITION CONTROL AND A METHOD THEREFOR

RELATED APPLICATIONS

The present application claims the benefit of U.S. Provisional Application Ser. No. 60/599,946 to Popescu et al, filed on Aug. 10, 2004, and entitled "A Circuit for Improved Sampling Edge Position Detection and a Method Therefor".

FIELD OF INVENTION

The invention relates to electronic circuits, and in particular to a method for adaptively controlling the sampling edge position of a high speed signal and a circuit therefor.

BACKGROUND OF THE INVENTION

In digital communications systems comprising transmission links, it is a primary goal to recover the transmitted data as faithfully as possible at the receiving end of a link. The bit error rate (BER) is an indication commonly used to characterize such systems.

Ideally, the BER is 0, but a number of impairments can affect the propagation of the signal resulting in signal degradation. Simple techniques of compensation, for example simple correction of the path frequency response such as boosting the high frequency components of the signal, are not adequate for dealing with high speed signals that may be severely degraded. Numerous other techniques have been proposed to overcome the effects of signal degradation. Some of these techniques are specific to the type of transmission medium, such as copper cable, radio propagation, links with multipath effects, or optical fiber, and all of them require a clock recovery circuit. The recovered clock is used to sample the received data.

A well known source of degradation in many communications systems is dispersion. The dispersion effect can be explained if we assume that the transmitted signal can be represented as the sum of its frequency components. In fiber optic systems, chromatic dispersion, polarization mode dispersion, and modal dispersion are the most common types of dispersion, causing the propagation characteristics to vary with frequency. The received signal is affected by the sum of these components, resulting in inter symbol interference (ISI) by spreading the energy of each optical pulse over neighboring bits. The dispersion can thus cause bit errors in the receiver by confusing 1s and 0s.

Dispersion is present in all optical systems, but its effects become worse over longer spans and at higher transmission speeds. Long-haul systems already incorporate optical compensation elements to correct for chromatic and polarization dispersion compensation.

A new alternative is electronic compensation. Electronic dispersion compensation (EDC) circuits have been proposed as a lower cost and lower power solution, see e.g. a copending U.S. patent application to Popescu entitled "High Speed Circuits for Electronic Dispersion Compensation" Ser. No. 10/638,386, filed Aug. 12, 2003, which is incorporated herein by reference.

A typical fiber optic communications system 10 with electronic dispersion compensation is illustrated in FIG. 1. Such a system includes a Transmitter 12, coupled to an electro-optic (E/O) converter 14, a fiber link 16, an opto-electrical (O/E) converter 18, an electronic dispersion compensation enabled (EDC) receiver 20, and an electronic dispersion compensation (EDC) controller 22.

A digital bit stream 24 from the transmitter 12 is sent to the E/O converter 14. The output of the E/O converter 14 is an optical signal 26 to be transmitted over the fiber link 16. The output of the fiber link 16 is an optical signal 28, coupled to the input of the O/E converter 18.

The output signal of the O/E converter 18 is an analog signal 30. The EDC Receiver 20 receives the analog signal 30, and outputs a digital data signal 32 and a recovered clock 34. The digital data signal 32 may be coupled to an input of the EDC controller 22 (dotted line), the output of which is a set of control signals 36, coupled to a control input 38 of the EDC Receiver 20.

As described above, degradation caused by dispersion distorts the signal transmitted by the fiber link 16. As a result, the analog signal 30 at the output of the O/E Converter 18 is not an exact replica of the digital bit stream 24 that was sent by the transmitter 12.

The purpose of the EDC Receiver 20 is to process the analog signal 30 into the digital data signal 32, and be as close a representation of the original digital bit stream 24 as possible. The method used by the EDC Receiver 20 is generally based on the idea of reversing the impairment (dispersion) caused by the fiber link.

A direct approach to improving the performance of digital transmission systems is to consider the geometry of the signal eye and apply adaptive compensation circuitry to correct the degradation prior to sampling the signal, such adaptive compensation circuitry requiring an accurate sampling edge position of a high speed signal.

For example, in U.S. Patent Application 20040037572 to Matsuyama published Feb. 26, 2004, the signal path, prior to discrimination into 1s and 0s, is processed by band pass filters and equalization filters where the equalization filter coefficients are computed to compensate both frequency dependent loss and group delay distortions. The computation is done in the frequency domain using Fast Fourier Transform (FFT) techniques, based on time shifted samples of the received waveform. While this method may theoretically be used to realize high-accuracy compensation for waveform degradation of a received signal stemming from chromatic dispersion, polarization mode dispersion or the like without employing a dispersion compensation fiber or a polarization maintaining fiber, it is an expensive method, requiring a large amount of very high speed circuitry.

A different approach, in which additional compensation is based on direct observation of the received eye is disclosed in U.S. Patent Application 20030011847 to Dai, Fa et al. published Jun. 5, 2002. This technique is based on a complex feedback system which includes estimating error rates by sampling the eye with variable delays in time X-detect) and variable voltage thresholds (Y-detect), periodically evaluating the results in a digital signal processor (DSP), and re-adjusting the variable sampling parameters, as well as adjusting feed forward equalizer (FFE) and decision feedback equalizer (DFE) parameters.

Unfortunately, the method proposed by Dai et al. (US2003/0011847) is not practical to implement for high speed applications. This solution will require significant power dissipation, and its implementation is distributed amongst several integrated circuits. In particular, it requires two high speed counters, two programmable high speed delay circuits, a VCO with quadrature outputs, and an external DSP, the function of which is insufficiently explained. The high speed counters and the high speed programmable delay circuits, operating at 10 GHz or higher clock frequency, will dissipate a significant amount of power, and as a result will make such a circuit impractical to implement. Generating the high frequency quadrature clock and the need to distribute in-phase and quadrature clocks to many blocks, while maintaining the phase relationship between the clocks, makes this prior art solution impractical for operation at 10 GHz or higher frequency clocks. It is difficult to generate precise variable delays at 10 GHz, consequently the eye-open X-Detect may generate inaccurate results. Nor is it possible to calibrate and confirm its efficacy as the absolute variable delays cannot be calibrated or measured.

While certain ways of performing sampling edge positioning have been described in the cited prior art references, what is still required is a much simpler, yet reliable method and circuitry for locating the sampling edge position, which would be especially applicable to the recovery of high speed signals, such as those of 10 and 40 Gbps fiber optic links, in the presence of signal eye degradation.

SUMMARY OF THE INVENTION

Therefore there is an object of the invention to provide a method for adaptive sampling edge positioning and a circuitry therefor.

According to one aspect of the invention there is provided a differential sampling edge position control circuit for use in a clock and data recovery circuit receiving a high speed data signal, the sampling edge position control circuit comprising:
  a differential clock delay circuit for generating an advanced, current and delayed clock signals;
  an differential advanced and delayed error detection circuit, comprising:
    means for sampling the high speed data signal with each of the advanced, current and delayed clock signals to generate advanced, current and delayed sampled data signals;
    means for comparing the advanced and delayed sampled data signals with the current sampled data signal to generate respective advanced and delayed error signals; and
    memory means for recording the occurrence of the first of each of the advanced and delayed error signals during a selected time interval;
  a logic circuit for processing the records of said occurrences, clearing said records after the selected time interval, and generating an output signal for a Analog Signal Generator (ASG); and
  the ASG generating an analog phase offset control signal in response to the output signal from the logic circuit, for adjusting a sampling edge position of the clock and data recovery circuit.

The differential clock delay circuit of the embodiment of the invention has fixed delay means for generating the advanced, current and delayed clock signals such that sampling edge positions of the advanced and delayed clocks are offset from the sampling edge position of the current clock by the same fixed delay.

The differential advanced and delayed error detection circuit comprises delay elements for compensating for respective delays introduced to the sampled data signals by the differential clock delay circuit to time align the advanced, delayed and nominal sampled data at the comparator input.

The ASG comprises a register for storing a value defining the analog phase offset control signal, the stored value being incremented or decremented in response to the output signal from the logic circuit, the ASG further comprising a Digital-to-Analog Converter (DAC) generating the analog phase offset control signal in response to the stored value. For high speed application, the circuitry is implemented so that the analog phase offset control signal is a differential signal. The differential advanced and delayed error detection circuit comprises delay elements for compensating for respective delays introduced to the sampled data signals by the differential clock delay circuit to time align the advanced, delayed and nominal sampled data at the comparator input. Conveniently, the memory means comprises set-reset latches.

The sampling edge position control circuit described above is designed for use in a clock and data recovery (CDR) circuit receiving a high speed data signal, the CDR having a phase offset control. The CDR comprises:
  means for acquiring a clock signal from the received high speed data signal, the means for acquiring including a phase offset control circuit for adjusting a sampling edge position of the clock and data recovery circuit; and
  the sampling edge position control circuit as described above for controlling said sampling edge position;
  the phase offset control circuit being operatively responsive to the phase offset control signal from said sampling edge position control circuit.

In the embodiment of the invention, the CDR is a Phase Lock Loop (PLL) based CDR. Alternatively, it may be another type CDR, e.g. a direct clock extraction CDR.

According to another aspect of the invention there is provided a differential error detection circuit for a sampling edge position control circuit for a clock and data recovery circuit receiving a high speed data signal, the differential error detection circuit comprising:
  a differential clock delay circuit for generating an advanced, current and delayed clock signals;
  a differential advanced and delayed error detection circuit, comprising:
    means for sampling the high speed data signal with each of the advanced, current and delayed clock signals to generate advanced, current and delayed sampled data signals;
    means for comparing the advanced and delayed sampled data signals with the current sampled data signal to generate respective advanced and delayed error signals; and
    memory means for recording the occurrence of the first of each of the advanced and delayed error signals during a selected time interval.

In the embodiment of the invention, the differential clock delay circuit has fixed delay means for generating the advanced, current and delayed clock signals such that sampling edge positions of the advanced and delayed clocks are offset from the sampling edge position of the current clock by the same fixed delay. The differential advanced and delayed error detection circuit comprises delay elements for compensating for respective delays introduced to the sampled data signals by the differential clock delay circuit, and the memory means comprises set-reset latches.

According to one more aspect of the invention there is provided a method for controlling a sampling edge position in a clock and data recovery (CDR) circuit, the CDR having a phase offset control circuit for adjusting the sampling edge position, the CDR receiving a high speed data signal, the method comprising:
  (a) generating one or more error signals from the received high speed data signal, comprising:
    (i) sampling the high speed data signal with each of an advanced, current and delayed clock signal to generate advanced, current and delayed sampled data signals;

(ii) comparing the advanced and delayed sampled data signals with the current sampled data signal to generate respective advanced and delayed error signals; and (b) processing the generated advanced and delayed error signals to generate a phase offset control signal to adjust the sampling edge position in the CDR.

The method further comprises recording in a memory the occurrence of the first of each of the advanced and delayed error signals during a selected time interval, the step of recording being performed before the step (b).

According to the embodiment of the invention, the step (b) comprises:

(iii) setting a selected time interval (T.out) to a predetermined time interval;

(iv) clearing the memory and waiting for the selected time interval to expire; and (v) if the advanced and delayed error signals are not equal, adjusting the sampling edge position by a fraction of the clock period.

The step (b) further comprises:

(vi) if the advanced and delayed error signals are equal, changing the selected time interval to another longer predetermined time interval, and repeating the steps (iv) to (vi) until the selected time interval reaches its maximum value (Tmax).

The method further comprises a step (c) of repeating the steps (a) to (b) as long as the high speed data signal is being received.

In an acquisition mode, the step (c) comprises repeating the steps (a) to (b) until the advanced and delayed error signals are equal.

In an adaptation mode, the step (c) comprises repeating the steps (a) to (b) after waiting a predetermined Cycle time, e.g. "n" seconds.

The step (c) is terminated when the phase offset control signal reaches the end of its range.

According to another aspect of the invention there is provided a method for adapting sampling edge position in a clock and data recovery (CDR) circuit receiving a high speed data signal, the CDR having a phase offset control circuit, the method comprising the steps of:

(a) setting a sampling edge position by setting a clock phase offset by means of the phase offset control circuit;

(b) setting an adaptation delay time interval equal to zero;

(c) adapting said sampling edge position, comprising the steps of:

(i) waiting for a time period equal to the adaptation delay time interval;

(ii) sampling the high speed data signal with each of the advanced, current and delayed clock signals to generate advanced, current and delayed sampled data signals;

(iii) comparing the advanced and delayed sampled data signals with the current sampled data signal to generate respective advanced and delayed error signals;

(iv) recording in a memory the occurrence of the first of each of the advanced and delayed error signals during a selected time interval and adjusting the clock phase offset in response to the recorded error signals;

(v) changing the adaptation delay time interval to a positive value if the adaptation delay time interval is equal to zero, and the advanced and delayed error signals are equal; and (d) repeating the step (c) as long as the high speed data signal is present and within the CDR range.

In the above method, the step (iv) comprises:

(vi) setting the selected time interval to a predetermined time interval;

(vii) clearing the memory and waiting for the selected time interval to expire;

(viii) if the advanced and delayed error signals are equal, changing the selected time interval to another longer predetermined time interval, and repeating the steps (vii) to (viii) a number of times, otherwise adjusting the clock phase offset by a fraction of the clock period.

The step (viii) comprises adjusting the clock phase offset in a direction opposite to that indicated by the recorded error signal.

The CDR as described above may be formed on a single semiconductor substrate and manufactured in bipolar or MOSFET technology. The CDR, the sampling edge position control circuit, or the error detection circuit described above may be part of another semiconductor device. The CDR may be manufactured in an electronic package, and/or formed on a circuit board.

BRIEF DESCRIPTION OF THE DRAWINGS

An embodiment of the invention will now be described, by way of example, with reference to the accompanying drawings in which.

DETAILED DESCRIPTION OF THE EMBODIMENT OF THE INVENTION

The present invention is concerned with the automatic adaptation of the sampling edge position for a Clock and Data Recovery (CDR) having clock-to-data phase offset control.

For an undistorted signal, symmetrical on the vertical axis, the optimum eye sampling time (sampling edge position) will be in the middle of the eye, at 50%. For a distorted eye, performance can be improved by shifting the sampling point away from the eye center. This is accomplished using a sampling edge position control or phase offset (offset from the eye center) control circuit incorporated in the clock and data recovery block (CDR).

Figure 1:
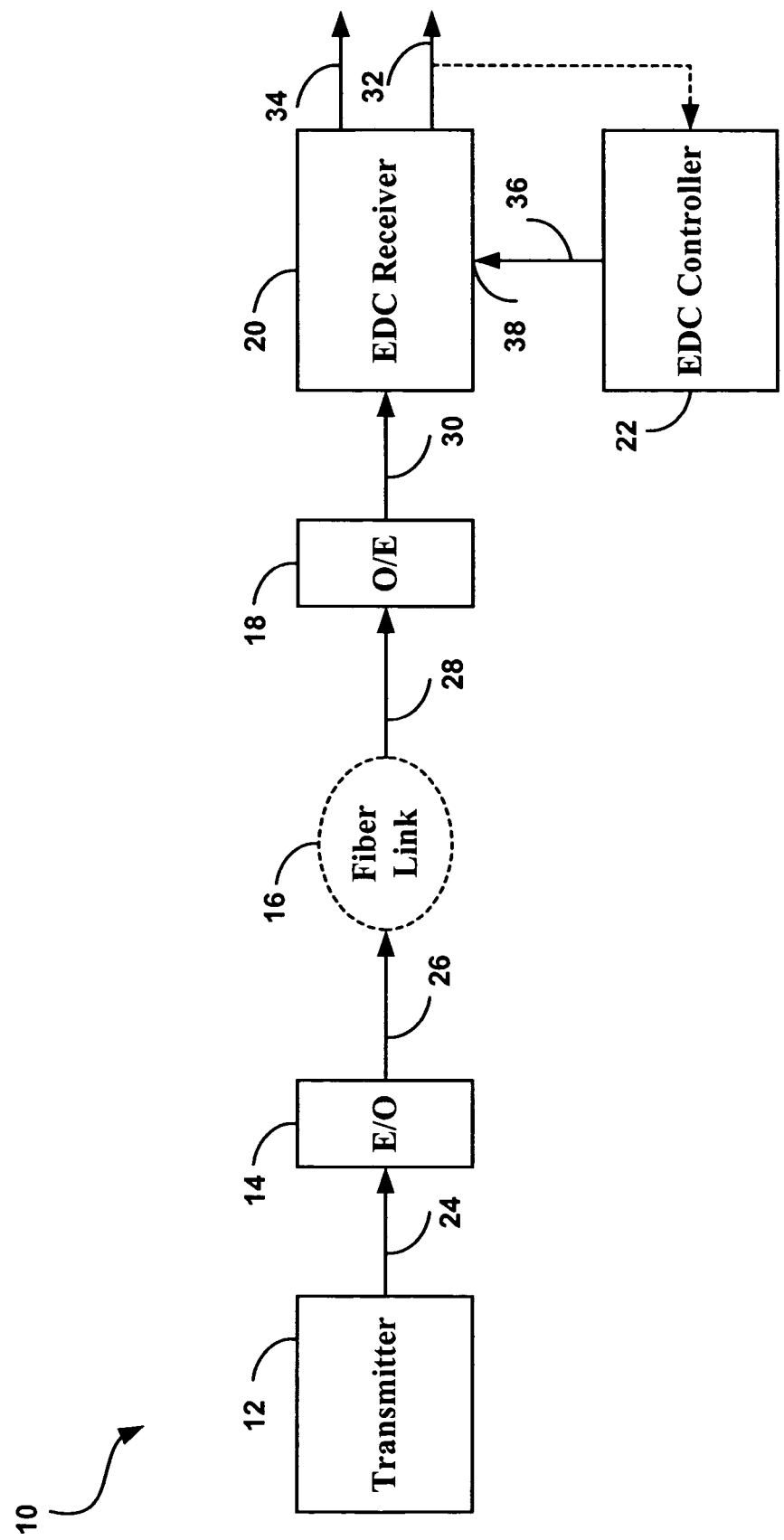
FIG. 1 illustrates a typical fiber optic communications system with electronic dispersion compensation of the prior art.
Figure 2:
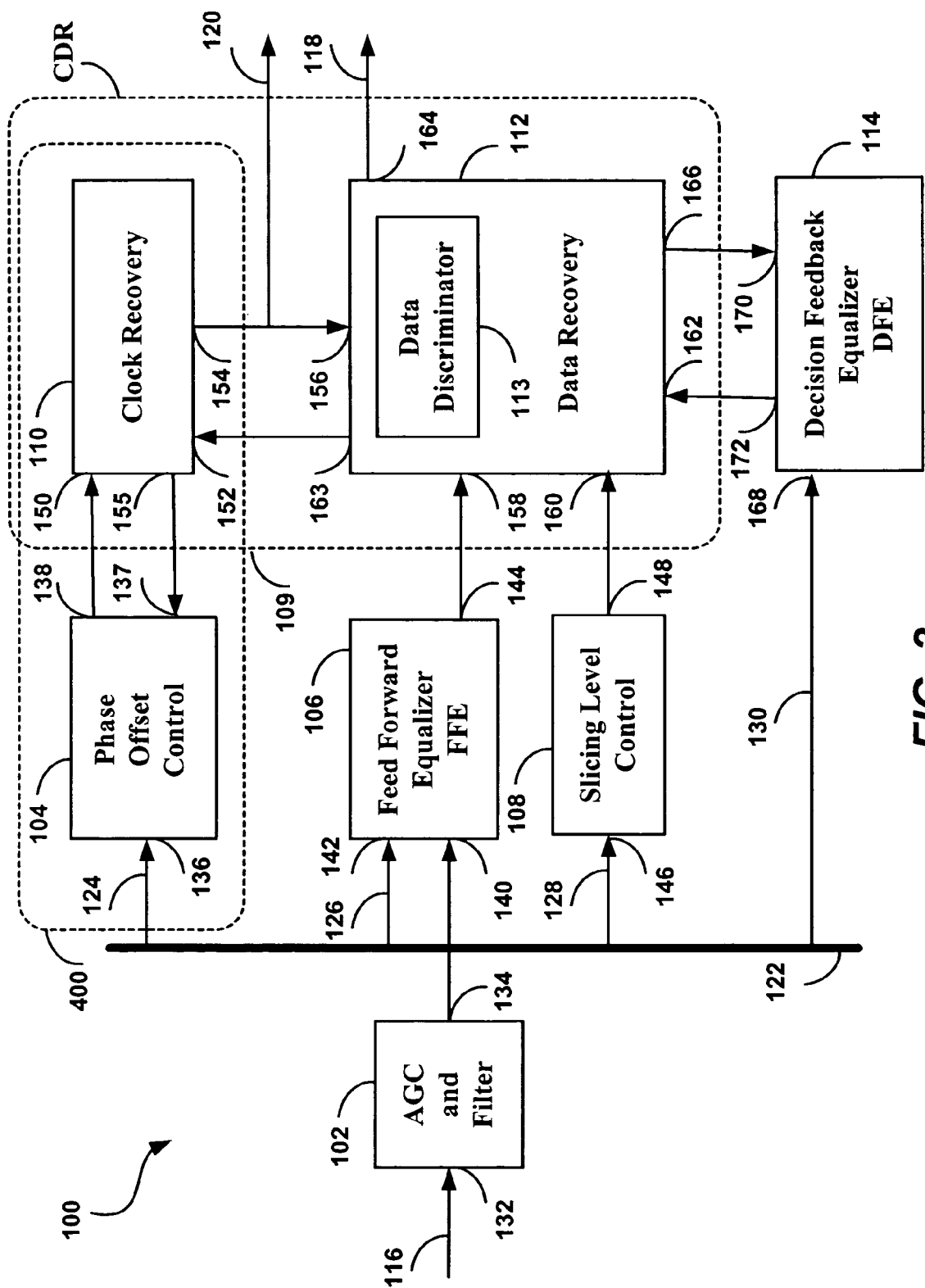
FIG. 2 is a system level block diagram of a differential receiver circuit with electronic dispersion compensation.

An Adaptive Sampling Edge Position Control Circuit and method have been developed, which may be incorporated into a CDR circuit having phase offset control. It is understood that the sampling edge position detection circuit of the embodiment of the present invention, providing a capability for improved and adaptive sampling edge position. This may be used in conjunction with the differential receiver circuit of the co-pending application to Popescu cited in the Background section, or with any other circuit capable of shifting the phase of the clock with respect to the data. The receiver circuit from this co-pending application is shown in FIG. 2. Alternatively, it is understood that the sampling edge position detection circuit and method of the embodiment of the invention may also be applied to other circuits, and to other types of clock recovery.

For convenience, and by way of example, the method and circuit of the embodiment of the invention will be described in conjunction with a differential receiver circuit with electronic dispersion compensation from the co-pending application to Popescu shown in FIG. 2.

Briefly recapitulated from the description of the above mentioned co-pending application, there is provided a receiver circuit 100, comprising:

a feed forward equalizer (FFE) circuit 106 for receiving a dispersion distorted analog signal (134) and processing the received signal to generate an equalized analog data signal (dispersion compensated signal) 144;

a clock and data recovery circuit (CDR) 109 for receiving the equalized analog data signal 144 and processing the received equalized analog data signal 144 to generate a recovered clock signal 120, a retimed digital data signal 118, and a phase offset enable signal 137; and a phase offset control circuit 104 for adjusting the phase at which the equalized analog data signal 144 is sampled by the clock and data recovery circuit 109 in response to the phase offset enable signal 137.

The combination of the clock recovery 110 and the phase offset control circuit 104 will be referred to as a Phase Adjustable Clock Recovery circuit 400.

The receiver circuit 100 further comprises an AGC and Filter block 102; a Slicing Level Control block 108; and a Decision Feedback Equalizer (DFE) 114. The Clock and Data Recovery circuit (CDR) 109 is comprised of a Clock Recovery block 110 and a Data Recovery block 112.

The receiver circuit 100 further comprises a number of (differential) analog control signals 122, derived from a number of digital-to-analog converters not shown, including a Phase Offset Control signal 124.

The method and circuitry for an improved and adaptive edge position sampling of the embodiment of the present invention may be used to enhance the receiver circuit 100, specifically the Phase Adjustable Clock Recovery circuit 400 of the receiver circuit 100.

Figure 3:
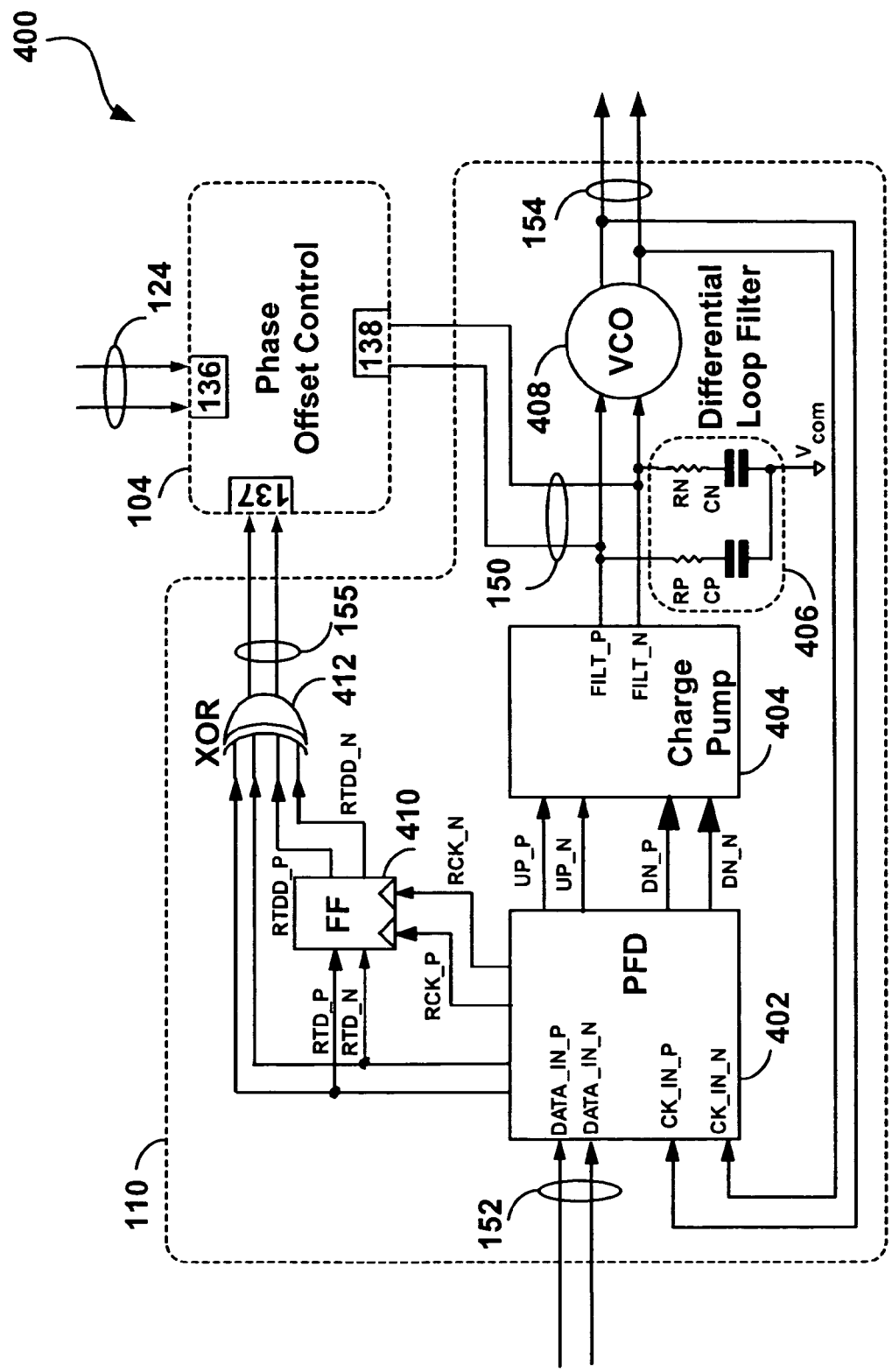
FIG. 3 is an expanded functional block diagram showing the Phase Adjustable Clock Recovery circuit 400 of FIG. 2.

FIG. 3 of the present application is a reproduction of FIG. 15 of the cited co-pending application, showing the Phase Adjustable Clock Recovery circuit 400.

Briefly recapitulated from the above mentioned co-pending application, there is provided a Phase Adjustable Clock Recovery circuit 400 comprising the Clock Recovery 110 and the Phase Offset Control 104 from FIG. 2. The clock recovery block 110 extracts the timing information from the raw data signal 152 (DATA_IN) and generates the recovered clock (RCK) and the recovered data (RTD). The Clock Recovery 110 further includes a phase-frequency detector (PFD) 402 and a Voltage Controlled Oscillator (VCO) 408, where the output 158 of the VCO 408 is directly coupled to the CK_IN input of the PFD 402. The Phase Offset Control 104 provides a capability to vary the sampling time of the recovered clock (RCK) with respect to the recovered data (RTD), under control of the Phase Offset Control input 136 which is an analog control signal (the Phase Offset Control signal 124 of FIG. 2). Note that all signals shown in FIG. 3 are differential signals. The functionality of clock and data recovery with phase offset control is described in detail in the co-pending application.

The above mentioned co-pending application discloses a differential receiver circuit with electronic dispersion compensation, including FFE and DFE, and a capability for phase offset control.

Figure 4:
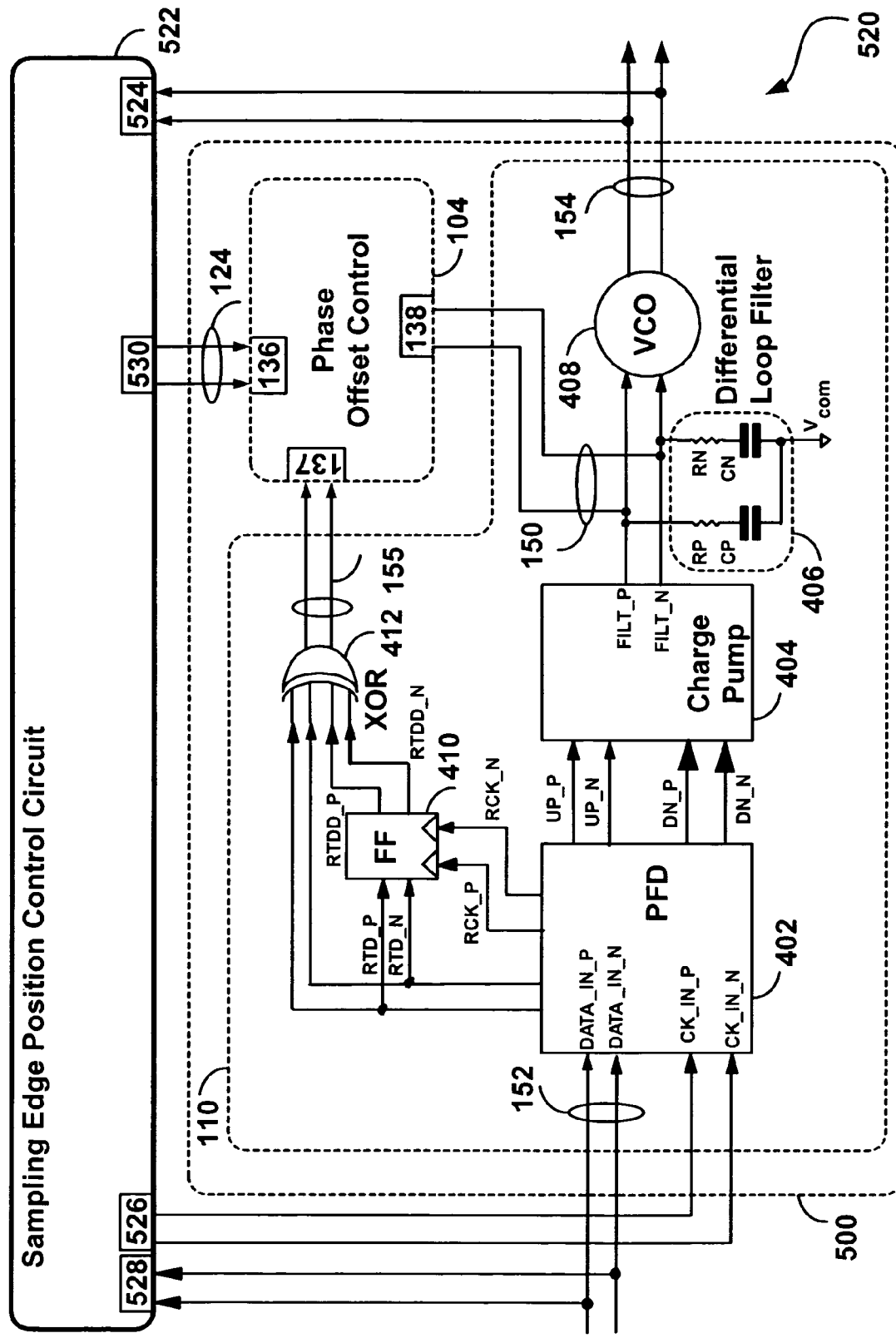
FIG. 4 is a schematic diagram of an Improved Clock Recovery 520 including a modified Phase Adjustable Clock Recovery circuit 500, similar to the Phase Adjustable Clock Recovery circuit 400 of FIG. 3, and the Differential Sampling Edge Position Control Circuit 522 of the embodiment of the invention.

FIG. 4 shows an Improved Clock Recovery circuit 520 comprising a Modified Phase Adjustable Clock Recovery circuit 500 and a Differential Sampling Edge Position Control Circuit 522. The Differential Sampling Edge Position Control Circuit 522 comprises a recovered clock input 524, a delayed clock output 526, a data input 528, and a phase offset control output 530, providing the analog Phase Offset Control signal 124 of FIG. 3.

The Modified Phase Adjustable Clock Recovery 500 circuit includes the circuitry of the Phase Adjustable Clock Recovery circuit 400 of FIG. 3 with the same reference numerals, but the modified Phase Adjustable Clock Recovery 500 has been modified to allow the output 158 of the VCO 408 to be routed to the recovered clock input 524 of the Differential Sampling Edge Position Control Circuit 522, instead of being directly connected to the CK_IN input of the PFD 402. Similarly, the CK_IN input of the PFD 402, not being directly connected to the output 158 of the VCO 408, is connected to the delayed clock output 526 of the Differential Sampling Edge Position Control Circuit 522.

The path from the recovered clock input 524 of the Differential Sampling Edge Position Control Circuit 522, through the Differential Sampling Edge Position Control Circuit 522, to its delayed clock output 526, provides a very small delay. The position of the sampling edge is thus delayed such that at zero phase offset, it is in the center of the eye. The CDR is thus adapted to accommodate the new circuit.

The Modified Phase Adjustable Clock Recovery 500 thus operates essentially in the same fashion as the Phase Adjustable Clock Recovery circuit 400 of FIG. 3, including the operation of the Phase Offset Control 104, but now includes method and circuitry to automatically adjust itself.

The data input 528 of the Differential Sampling Edge Position Control Circuit 522 is connected in parallel to the raw data signal DATA_IN 152 of the PFD 402, and the phase offset control output 530 of the Differential Sampling Edge Position Control Circuit 522 is connected to the Phase Offset Control input 136 of the Phase Offset Control 104.

The purpose of the Differential Sampling Edge Position Control Circuit 522 is to process the received raw data signal DATA_IN 152, received through its data input 528, acquire a clock signal 154 from the raw data signal DATA_IN 152, and in conjunction with the recovered clock input signal 524 (=clock signal 154), to generate an analog signal at the phase offset control output 530, such that an optimal phase offset is achieved.

The Clock and Data Recovery circuit (CDR) 109 is a Phase Lock Loop (PLL) based CDR. It is understood that other CDRs with a capability of Phase Offset Control may also be constructed, for example A CDR with direct clock extraction.

Figure 5:
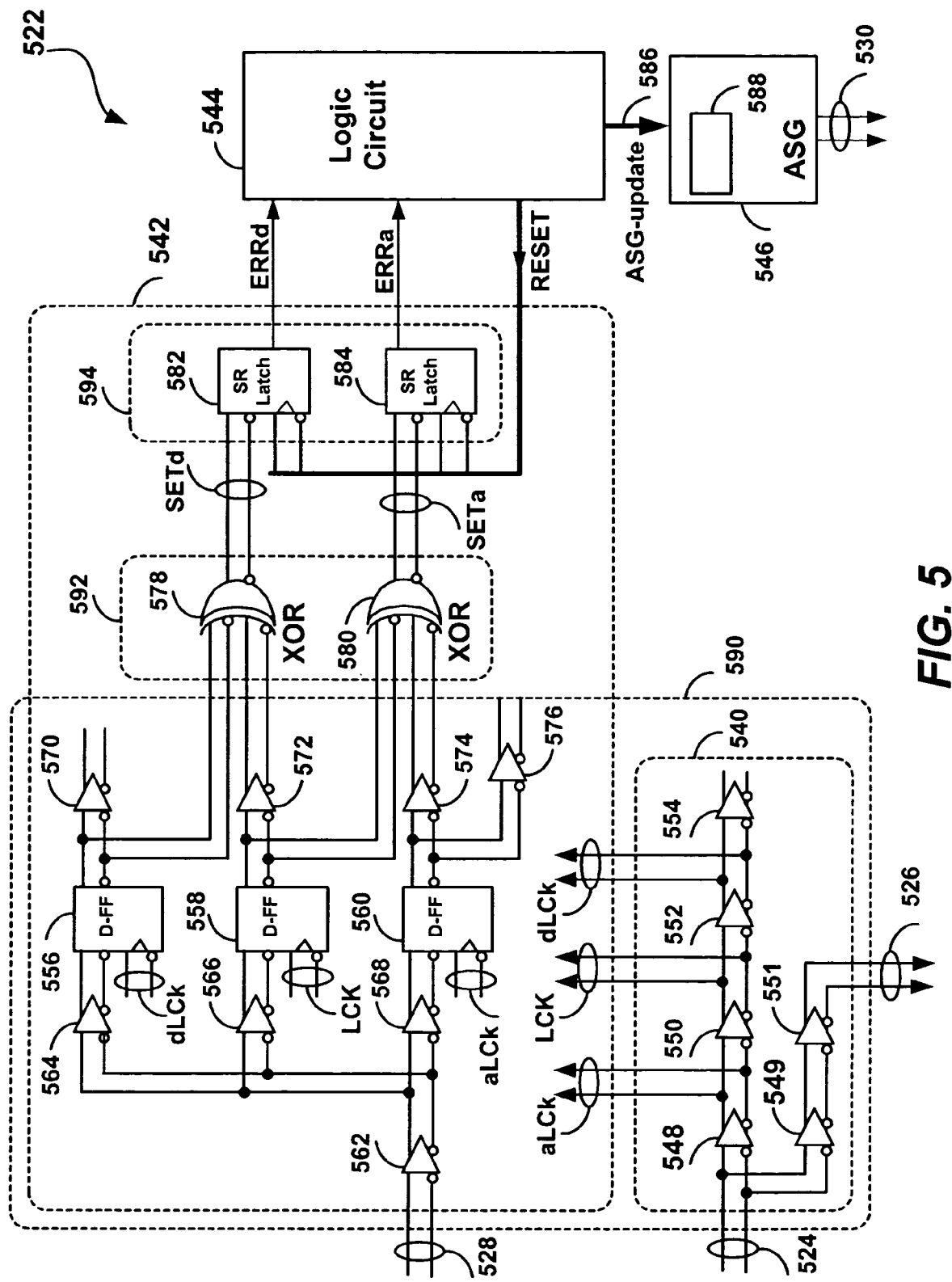
FIG. 5 shows a detailed circuit and block diagram of the Differential Sampling Edge Position Control Circuit 522 of FIG. 4.

FIG. 5 shows the Differential Sampling Edge Position Control Circuit 522 in more detail, including a differential clock delay circuit 540, an differential advanced and delayed error detection circuit 542, a logic circuit 544, and an Analog Signal Generator (ASG) 546. The combination of the differential clock delay circuit 540 and the differential advanced and delayed error detection circuit 542 forms a differential error detection circuit.

The differential clock delay circuit 540 comprises a number of differential buffers (548, 549, 550, 551, 552, and 554) acting as delay elements, and connected as follows:

the recovered clock input 524 is connected to the inputs of the differential buffers 548 and 549;

the output of the differential buffer 548 is connected to the input of the differential buffer 550;

the output of the differential buffer 550 is connected to the input of the differential buffer 552;

the output of the differential buffer 552 is connected to the input of the differential buffer 554; and the output of the differential buffer 549 is connected to the input of the differential buffer 551.

The differential clock delay circuit 540 receives the recovered clock input signal 524, and generates a number of delayed (time-shifted) clock signals, an advanced local clock (aLCK) at the output of the differential buffer 548, a local clock (LCK) at the output of the differential buffer 550, and a delayed local clock (dLCK) at the output of the differential buffer 552.

The output of the differential buffer 551 is connected to the delayed clock output 526.

Each of the differential buffers (548 to 554), i.e. each delay element provides a very small technology dependent delay, on the order of a fraction of the unit interval (clock period). In a circuit designed to operate at a clock rate of 10 GHz for example, the unit interval is 100 pico seconds (ps), and the delay of a typical differential buffer is fixed by design, in a range from 15 to 25 ps depending on technology and geometry and bias conditions. The differential buffer 554 is included to ensure that dLCK has the same rise and fall times as aLCK and LCK.

The differential advanced and delayed error detection circuit 542 comprises: three differential D-type Flip Flops (D-FF) 556, 558, and 560; eight differential buffers 562, 564, 566, 568, 570, 572, 574, and 576; two differential exclusive OR (XOR) gates 578 and 580, forming a comparator 592; and two differential transparent set-reset (SR) latches 582 and 584.

The differential buffers again act as delay elements, providing the necessary signal delays to match the delays of the differential clock delay circuit 540, as described in more detail below.

The signal of the data input 528 is coupled through the differential buffer 562 to the inputs of the three differential buffers 564, 566, and 568. The outputs of the three differential buffers 564, 566, and 568 are coupled to the data inputs of the three differential D-type Flip Flops (D-FF) 556, 558, and 560 respectively. The clock inputs of the three differential D-type Flip Flops (D-FF) 556, 558, and 560 are connected to the three time-shifted clock signals dLCK, LCK, and aLCK respectively which are generated by the differential clock delay circuit 540 described above.

The (differential) output of each of the three differential D-type Flip Flops (D-FF) 556, 558, and 560 is each connected to two loads as follows:

the output of the D-FF 556 (a delayed sampled data signal) is connected to the input of the differential buffer 570, and also to one input of the XOR gate 578;

the output of the D-FF 558 (a local or current or nominal sampled data signal) is connected to the input of the differential buffer 572, and also to one input of the XOR gate 580; and the output of the D-FF 560 (an advanced sampled data signal) is connected to the input of the differential buffer 574, and also to one input of the differential buffer 576. The other input of the differential XOR gate 578 is connected to the output of the differential buffer 572. Similarly, the other input of the differential XOR gate 580 is connected to the output of the differential buffer 574.

The outputs of the differential XOR gates 578 and 580 (labeled "SETd" and "SETa" respectively, representing delayed and advanced error signals respectively) are connected to the set inputs of the transparent SR-latches 582 and 584 respectively. The reset inputs of the SR-latches 582 and 584 are connected to the Logic Circuit 544 through a "RESET" signal. The outputs of the transparent SR-latches 582 and 584 are the error signals "ERRd" and "ERRa" respectively representing latched records of the occurrence of the corresponding delayed and advanced error signals, connected as inputs to the Logic Circuit 544.

The design of differential clock delay circuit 540 and of the differential advanced and delayed error detection circuit 542 is differential throughout, to provide optimal high-speed performance. As will be clear from the description that follows, circuit delays and the matching of the delays of different paths of the high speed circuitry are of the essence. As a technique to achieve the desired delays, differential buffers are inserted in the circuit to delay the signal by the delay of one buffer, and dummy buffers are connected to the outputs of circuit elements ensure the load factors are equal.

The logic circuit 544 includes the means to perform an adaptive algorithm that is run periodically, and is described in more detail below. The logic circuit 544 receives as inputs the "ERRa" and "ERRd" error signals, and provides a ASG-update signal 586 to the ASG 546. The ASG 546 in turn generates the phase offset control output 530. The logic circuit 544 provides the "RESET" signal to the differential advanced and delayed error detection circuit 542 for resetting error signals recorded in the SR-latches 582 and 584.

The overall function of the differential advanced and delayed error detection circuit 542 is to sample the received data signal 528 at three slightly different clock phases, compare the results of sampling, and store the results of the comparisons as error signals in the SR-latches 582 and 584, to provide the ERRa and ERRd error signals to the Logic circuit 544.

The three differential D-FFs 556, 558, and 560, together with their associated delay elements (the differential buffers 562, 564, 566, 568, 570, 572, 574, 576) and the differential clock delay circuit 540, constitute sampling means 590.

The differential clock delay circuit 540 provides the three delayed clock signals aLCK, LCK, and dLCK, where LCK may be considered to be the nominal or local clock phase, aCLK is advanced relative to LCK, and dCLK is delayed relative to LCK. The amount of the advance or delay is determined by the (designed to be equal) delays of the differential buffers 550 and 552 respectively.

Each of the three differential D-FFs 556, 558, and 560 receive the same data (with the same timing), buffered from the raw input data 528, but are clocked by the three different delayed (time-shifted) clocks (dLCK, LCK, and aLCK respectively), thus retiming the data at three different time points in the data eye (see FIG. 6 below).

Once retimed, the outputs from the three D-FFs 556, 558, and 560 are passed to the pair of XOR gates 578 and 580 (which form a comparator 592) that compare the decisions taken at the advanced and delayed clock times (aLCK and dLCK) with that taken at the local (or nominal) clock edge (LCK). Should the decided value be different on the local clock path compared with the advanced clock path, then the XOR gate 580 will output a "one", signifying an error for the advanced local clock position with respect to the local clock position (SETa).

Likewise, should the value from the delayed path be different from the local path, the XOR gate 578 will output a "one", signifying an error for the delayed clock position with respect to the local clock position (SETd). The purpose of the SR-latches 582 and 584 (memory means 594) is to hold any "one" values that appear at the XOR gate outputs for one execution of the adaptive algorithm performed in the Logic Circuit 544. The values (i.e. the SR-latches 582 and 584) are reset via the RESET input from the Logic Circuit 544, as part of the adaptive method's initialization procedure.

As described in more detail below, the latched "ERRa" and "ERRd" values are used to decide whether the local clock should be advanced or delayed. For example, if "ERRa" is one and "ERRd" is zero, it suggests that a decision error is less likely to occur if LCK is delayed slightly with respect to its current position. As their names suggest, the aLCK positive edge precedes the LCK positive edge by a fixed fraction of a unit interval, while the dLCK positive edge follows the LCK positive edge by a similar amount. LCK is positioned in such a way that the decision made by the LCK D-flip-flop 558 is the same as the one made by the latch at the input to the CDR (inside the PFD 402 of FIG. 4). This is achieved by ensuring that the clock-to-data alignment remains constant from the actual CDR re-timing circuit in the PFD of FIG. 4 to the LCK re-timing circuit in the differential advanced and delayed error detection circuit 542 of FIG. 5. To guarantee this condition, all circuit blocks through which the data signal is processed from the circuit input 528 prior to the D-flip flop must be delay matched by the same or equivalent circuit blocks in the clock path starting from the recovered clock input 524. The dLCK and aLCK are time-shifted, but otherwise identical copies of the LCK signal. As shown in FIG. 5, this time shift is realized by tapping off the clock signal one buffer before (aLCK) and one buffer after (dLCK) the LCK position. In order to compare the advanced and delayed samples derived from the flip-flops (D-FFs 556, 558, and 560) synchronously, the time-shift introduced by the aLCK and dLCK signals must be removed. This is achieved by time aligning the D-flip-flop outputs using buffers (used as delay elements) that exactly match those used in the clock delay chain in FIG. 5. As an example, consider the XOR gate 580 in which the advanced decision is compared to the local decision. In this case, the difference in the timing of the two decisions is defined by the clock buffer 550. In order to compare these decisions at the same point in time, the advanced decision must be delayed by an amount equal to the delay introduced by the buffer 550. This is most readily achieved by adding the buffer 574 (having the same delay as the clock buffer 550) between the output of the D-FF 560 and the input of the XOR gate 580. Two additional buffers (570 and 576) are also included in the circuit at the advanced and delayed flip-flop outputs (the outputs of the D-FFs 560 and 556), although the outputs of these buffers are not connected. The purpose of these buffers is to ensure that all three flip-flops (D-FFs 556, 558, and 560) see the same output load regardless of how they are connected to the XOR gates 578 and 580. This ensures that all three outputs have the correct timing as well as comparable rise and fall times.

Figure 6A:
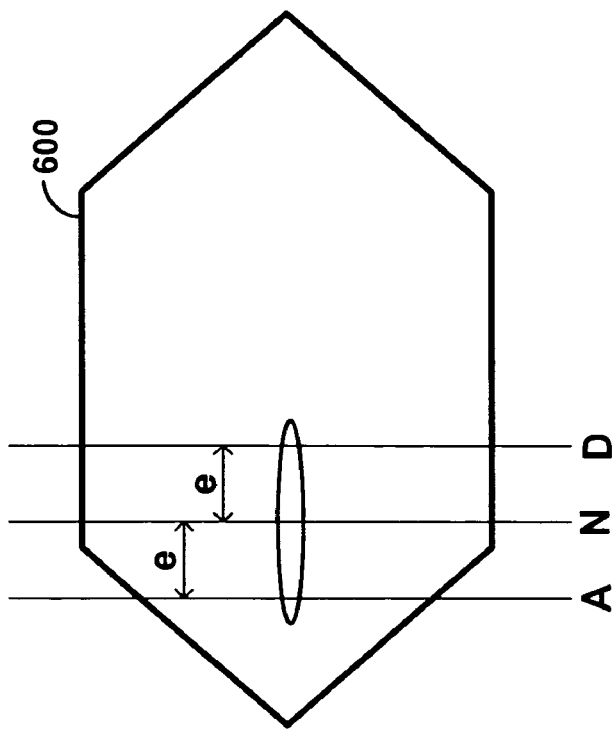
FIG. 6a shows a stylized eye diagram with a group of sampling edges centered.
Figure 6B:
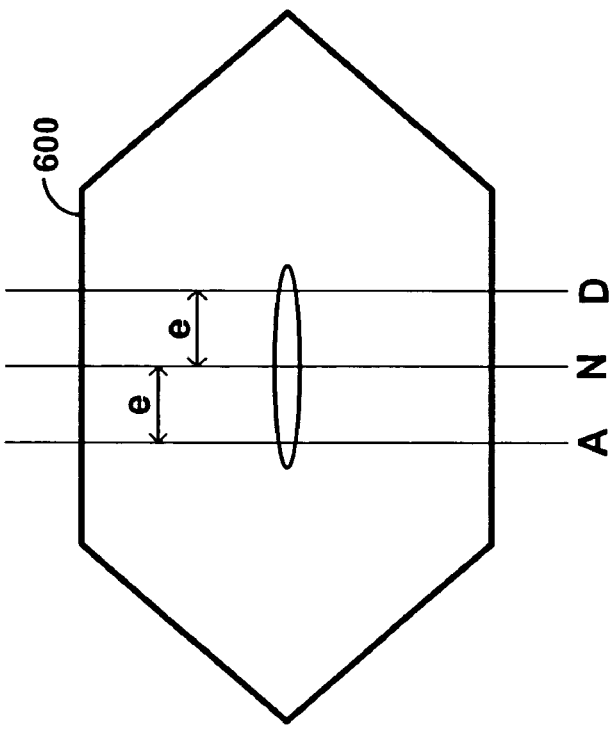
FIG. 6b shows a stylized eye diagram with a group of sampling edges shifted.

FIGS. 6a and 6b shows two cases of a stylized data eye diagram.

FIG. 6a shows a nominal eye diagram 600 with three sampling edges "A", "N", and "D", corresponding to the clock edges aLCK, LCK, and dLCK respectively of FIG. 4. The sampling edge "N" in the center of the data eye corresponds to the nominal sampling edge, and the sampling edges "A" and "D" are advanced and delayed with respect to the nominal edge "N" by an equal and fixed amount "e".

FIG. 6b shows the same eye diagram 600, however with the three sampling edges "A", "N", and "D" as a group shifted to the left, relative to the center of the eye. Note that the sampling edges "A" and "D" are advanced and delayed with respect to the nominal edge "N" by the same equal and fixed amount "e" as in FIG. 6a.

As described in the cited co-pending application (see the section Operation of Clock Recovery 110 with Phase Offset Control 104 (FIGS. 18, 19) of the cited co-pending application to Popescu, the nominal sampling edge of the clock 154 can be shifted relative to the center of the eye by means of the phase offset control 104.

This mechanism is exploited in the embodiment of the present invention. The differential clock delay circuit 540 ensures that the advanced and delayed sampling edges "A" and "D", along with the nominal sampling edge "N" as a group, may be shifted relative to the center of the eye by means of the phase offset control 104.

The Logic Circuit 544 includes means to implement the adaptive algorithm that, briefly stated, evaluates the error signals "ERRd" and "ERRa" from the differential advanced and delayed error detection circuit 542, effectively estimating advanced and delayed bit error rates, by resetting the SR-latches 582 and 584, and then waiting for a selected time interval to observe the occurrence of an error (the first such errors within the selected time interval, and latched as ERRd and/or ERRa signals). The logic circuit 544 then generates the ASG-update signal 586 accordingly, thus controlling (via the phase offset control 104) the position of the sampling edges "A", "N", and "D" in the data eye. On the other hand, the position of the sampling edges "A", "N", and "D" in the data eye may affect data errors that are detected by the differential advanced and delayed error detection circuit 542, i.e. the detected advanced and delayed data errors. For example, considering the sampling edge positions in FIG. 6b, the advanced edge "A" is close to the left transition of the eye, possibly resulting in advanced errors (ERRa) being detected under non-ideal conditions, which would indicate that the position of the sampling edges "A", "N", and "D" should be shifted to the right by some amount. Similarly, if the sampling edge positions are close to the right edge of the data eye, delayed errors (ERRd) might be detected.

The Improved Clock Recovery circuit 520 thus includes an adaptive feedback mechanism whereby the Differential Sampling Edge Position Control Circuit 522 adjusts the phase offset control 136 (hence the sampling edge positions) until there are either no errors detected, or until the advanced and delayed error rates are the same. At this point a near optimum sampling position is considered to be achieved. The adaptive algorithm is run periodically in order to first find said near optimum sampling position, and then to track it and adapt to changes in transmission and circuit conditions, for instance changes caused by temperature shifts, as well as changes in data patterns which might cause pattern dependent changes in eye symmetry.

The Analog Signal Generator (ASG) 546 generates a differential analog signal (the phase offset control output 530), derived from a digital value stored in a register 588. The differential analog signal derived from the digital value stored in the register 588 may be generated by a conventional digital-to-analog converter, according to any of a number of methods that are familiar to persons skilled in the art. The register 588 is controlled from the Logic Circuit 544 through the ASG-update signal 586. In the preferred embodiment, the ASG 546 is designed to have a resolution of 128 discrete steps (7 bits), where the digital values range from decimal 0 (binary 0000000) to decimal 127 (binary 1111111), and the register 588 is a 7-bit register. The resulting analog signal range of the phase offset control output 530 is adjusted in conjunction with the modified Phase Adjustable Clock Recovery circuit 500 so that the digital value of decimal 0 corresponds to a phase offset of −X (left of center), the digital value of decimal 64 corresponds to a phase offset of approximately X/127 picoseconds corresponding to the middle of the eye, and the digital value of decimal 127 corresponds to a phase offset of +X picoseconds (right of center). In a 10 Gb/s receiver, the value of X is preferably 32 picoseconds (ps). The adjustable phase offset range of + and −32 ps thus covers approximately 64% of the eye, centered around the middle of the eye.

Figure 7:
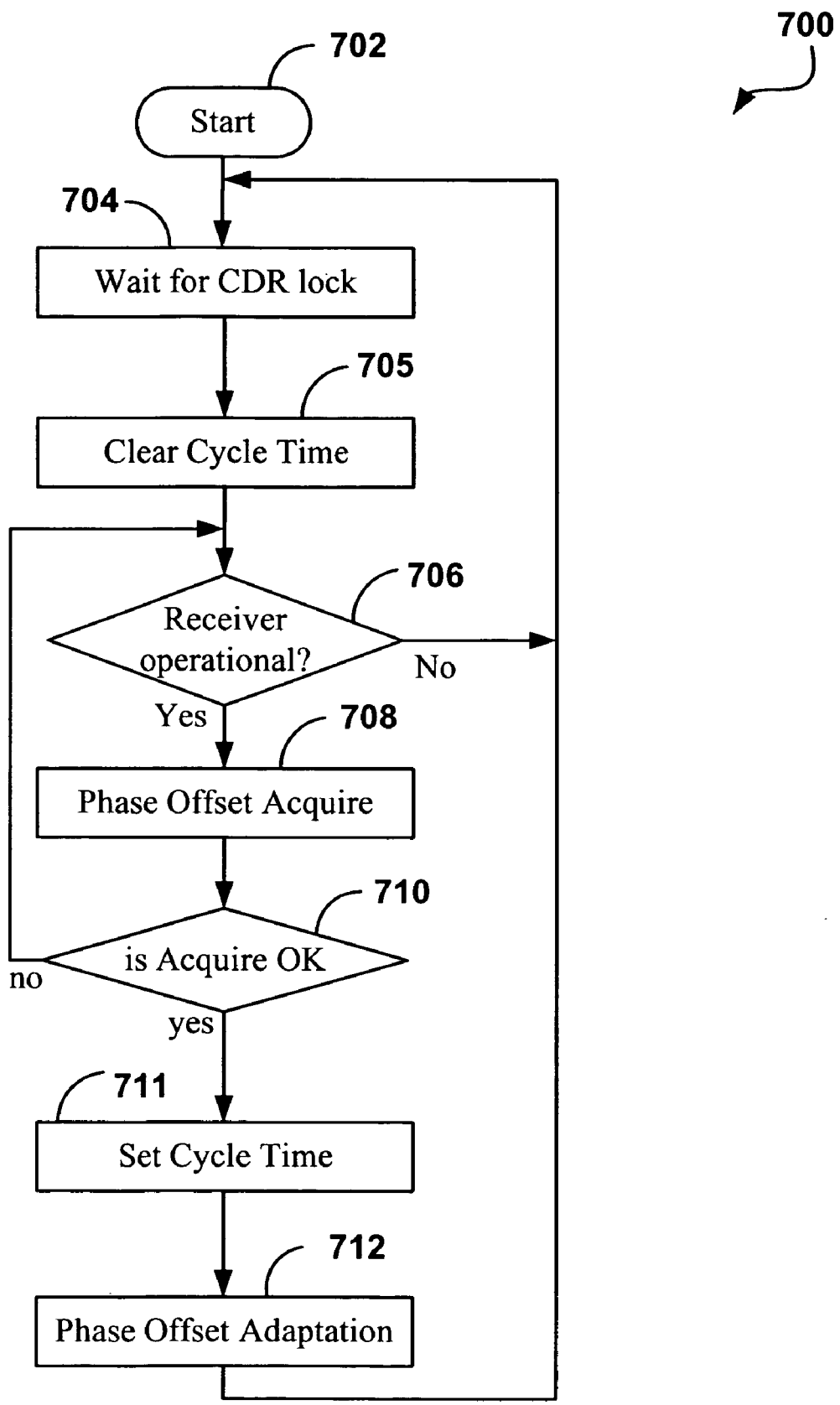
FIG. 7 shows a top-level flow chart of a method for adapting the Sampling Edge Position according to the embodiment of the invention.

FIG. 7 shows a flow chart of a method for adapting the Sampling Edge Position 700, including the following steps:

702 "Start";
704 "Wait for CDR lock";
705 "Clear Cycle Time";
706 "is Receiver Operational?";
708 "Phase Offset Acquire";
710 "is Acquire OK";
711 "Set Cycle Time"; and
712 "Phase Offset Adaptation".

The steps 708 "Phase Offset Acquire" and 712 "Phase Offset Adaptation" include the adaptive algorithm executed in the Logic Circuit 544 at different speeds (with different cycle times). The steps 708 "Phase Offset Acquire" and 712 "Phase Offset Adaptation", as well as the adaptive algorithm executed in the Logic Circuit 544 are described in more detail with the help of expanded flow charts in FIGS. 8, 9, and 10 below.

After the step 702 "Start", the step 704 "Wait for CDR lock" includes the functionality of the modified Phase Adjustable Clock Recovery circuit 500 of FIG. 5. This functionality is well known to persons skilled in the art, and similar to that described in the co-pending application with respect to the Phase Adjustable Clock Recovery circuit 400 of that application. The step 704 "Wait for CDR lock" is repeated until the received signal is acquired, i.e. a stable clock signal is obtained. In the step 706 "is Receiver Operational?", acquisition of the signal is confirmed by conventional means, not shown in FIG. 5. By way of explanation, the signal may fail (as tested in the step 706 "is Receiver Operational?") in a number of ways, for example not be within acquisition range of the CDR, be of too low an amplitude, or contain too much degradation or noise.

The steps 704 "Wait for CDR lock" and 706 "is Receiver Operational?" may be described as a signal acquisition phase. During the signal acquisition phase the ASG 546 is initialized to output a phase offset control output 530 voltage corresponding to zero phase offset (a digital value of decimal 64 in the preferred embodiment), thus setting the sampling edge position in the middle of the eye.

Figure 9:
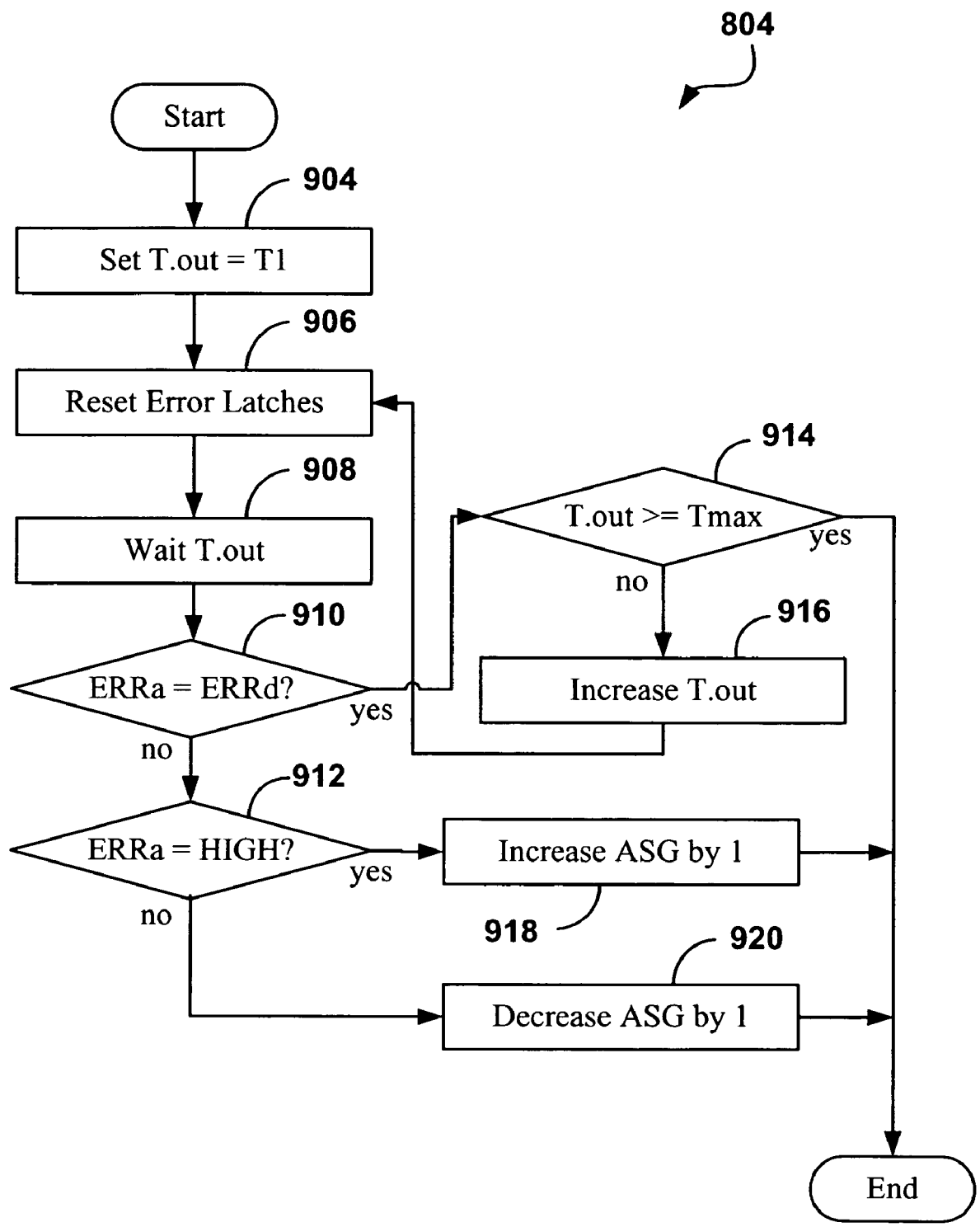
FIG. 9 shows a detailed flow chart of the step 804 "Adaptive Algorithm" of the method of FIG. 8.

The steps 708 "Phase Offset Acquire" and 712 "Phase Offset Adaptation" are similar, both making use of an adaptive algorithm described in detail below (FIG. 9). A cycle time interval is used in the step 712 "Phase Offset Adaptation" to set the rate of adaptation and tracking of the optimal sampling edge position. However, in the step 708 "Phase Offset Acquire", rapid convergence is required to obtain an initial good sampling edge position.

In the step 705 "Clear Cycle Time", the cycle time interval is set to zero.

After signal acquisition is confirmed ("yes" branch of the step 706 "is Receiver Operational?"), an initial phase offset is acquired in the step 708 "Phase Offset Acquire".

The step 708 "Phase Offset Acquire" is expanded in a flow chart in FIG. 8, described below.

If for any reason, phase offset acquisition fails ("no" branch of the step 710 "is Acquire OK") the signal acquisition phase (steps 704 and 706) is repeated.

After the step 710 "is Acquire OK" has verified that the phase offset acquisition succeeded (branch "yes"), the step 711 "Set Cycle Time" is performed.

In the step 711 "Set Cycle Time", the Cycle Time interval is set to a positive value, in preparation for the next step.

The step 712 "Phase Offset Adaptation" is performed continuously. The step 712 "Phase Offset Adaptation" terminates only if there is a signal failure or loss of clock synchronization.

The step 712 "Phase Offset Adaptation" is expanded in a flow chart in FIG. 10, described in detail further below.

Figure 8:
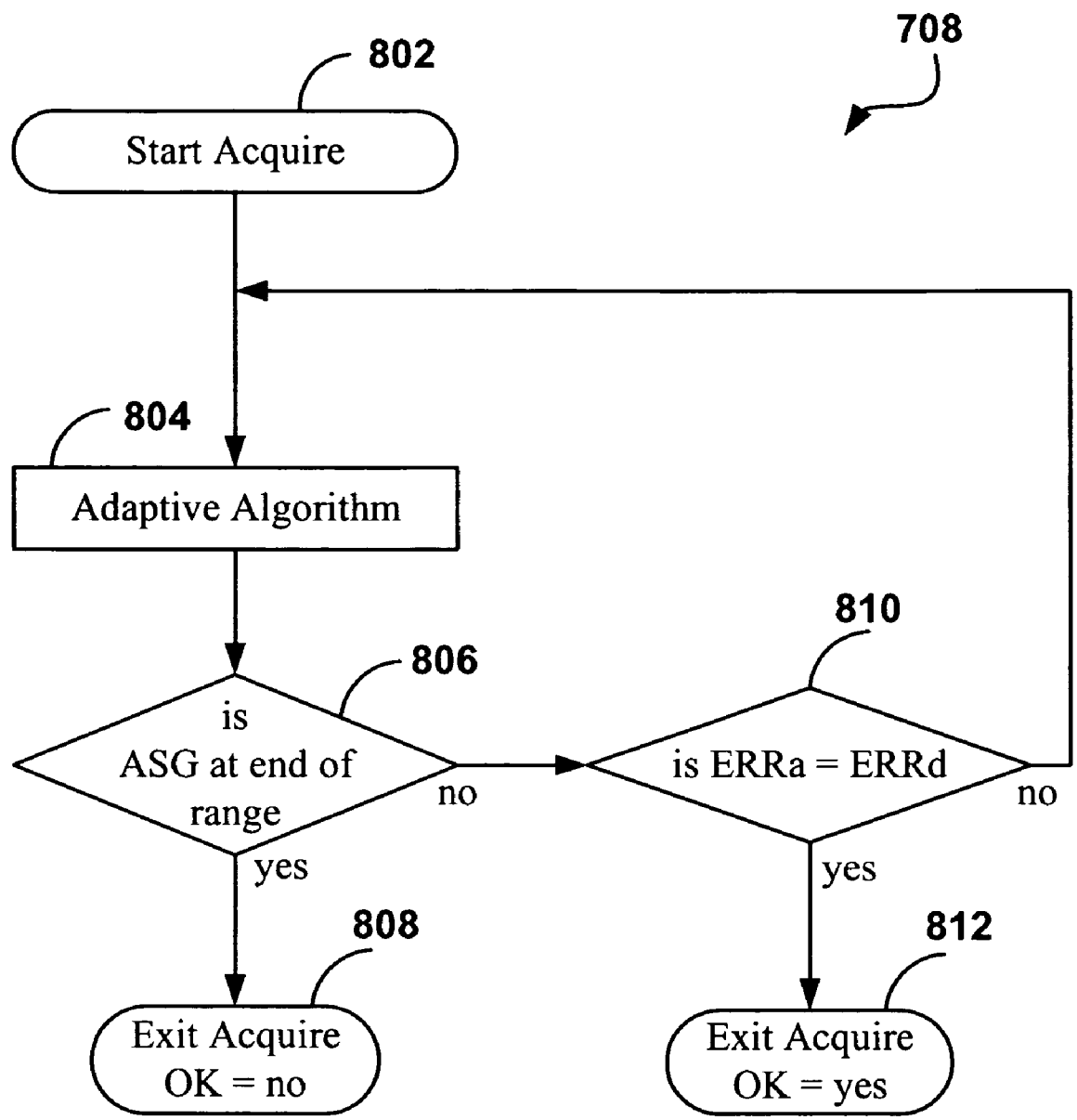
FIG. 8 shows a detailed flow chart of the step 708 "Phase Offset Acquire" of the method of FIG. 7.

FIG. 8 shows an expanded flow chart of the step 708 "Phase Offset Acquire", which includes the following steps:

802 "Start Acquire";
804 "Adaptive Algorithm";
806 "is ASG at end of range";
808 "Exit Acquire OK=no";
810 "is ERRa=ERRd"; and
812 "Exit Acquire OK=yes".

At the start of the step 708 "Phase Offset Acquire" (the step 802 "Start Acquire") the ASG 546 is initialized to output a phase offset control output 530 voltage corresponding to zero phase offset (a digital value of decimal 64 in the preferred embodiment). Then the step 804 "Adaptive Algorithm" is performed at least once, and repeated as long as the ASG 546 is within range (branch "no" of the step 806 "is ASG at end of range") and there is either an advanced or a delayed error detected (branch "no" of the step 810 "is ERRa=ERRd").

If the ASG 546 has reached either the negative or the positive end of its range (branch "yes" of the step 806 "is ASG at end of range"), the step 708 "Phase Offset Acquire" exits with failure at the step 808 "Exit Acquire OK=no". If there are no advanced or delayed error detected the values of ERRa and ERRd of the Sampling Edge Position Control Circuit 522 are equal (branch "yes" of the step 810 "is ERRa=ERRd"), and the step 708 "Phase Offset Acquire" exits with success at the step 812 "Exit Acquire OK=yes".

It is possible that both advanced and delayed errors are detected (ERRa=ERRd) after the same run of the step 804 "Adaptive Algorithm", and the ASG 546 is still in range. This could indicate a high bit error rate. In this case, the step 708 "Phase Offset Acquire" also exits with success at the step 812 "Exit Acquire OK=yes", and the step 712 "Phase Offset Adaptation" is allowed to proceed.

The step 804 "Adaptive Algorithm" is an algorithm designed to adjust the sampling edge position automatically based on the errors that the logic circuit 544 receives from the advanced and delayed error detector circuit 542 (the error signals ERRa and ERRd). The error detector circuit 542 generates the two error signals, the ERRa and ERRd signals, that are determined by sampling the eye using the early or advanced (aLCK), current or local (LCK), and delayed (dLCK) clocks as shown in FIG. 5. The three clocks correspond to the three sampling edges "A", "N", and "D" in FIGS. 6a and 6b.

Note that a change in the sampling edge position changes the phase of early (advanced), current (local), and late (delayed) clocks by the same delta amount. The sampled data symbols taken with early and current clocks (aLCK and LCK) are compared to generate the error signal ERRa, where a logic HIGH indicates that the sampled data symbols are not the same, and a logic LOW indicates that both sampled symbols are the same. At the same time, the sampled data taken from the current and late clocks (LCK and dLCK) are compared to generate the error signal ERRd, where a logic HIGH indicates that both sampled data symbols are not the same, and a logic LOW that they are the same.

By way of a qualitative explanation of the adaptive algorithm, the detection of an ERRa error signal might indicate that the present sampling edge position is too close to the left of the data eye, and should be shifted somewhat to the right. Similarly the detection of an ERRd error signal might indicate that the present sampling edge position is too close to the right of the data eye, and should be shifted somewhat to the left.

The "Adaptive Algorithm" (step 804) that is performed in the logic circuit 544 is designed to react to the detection of these error signals by shifting the sampling edge position in the opportune direction, using the ASG 546 and the Phase Offset Control 104 as means to effect such a shift.

FIG. 9 shows an expanded flow chart of the step 804 "Adaptive Algorithm", which includes the following steps:
904 "Set T.out=T1 ns";
906 "Reset Error Latches";
908 "Wait T.out";
910 "ERRa=ERRd?";
912 "ERRa=HIGH?";
914 "T.out >=Tmax";
916 "Increase T.out";
918 "Increase ASG by 1"; and
920 "Decrease ASG by 1".

Beginning with "START", the adaptive algorithm sets a timeout variable (a selected time interval) "T.out" to an initial value of T1 (the step 904 "Set T.out=T1").

The timeout variable "T.out" may be set to a range of predetermined discrete positive timeout values, T1, T2, . . . Tmax, generally T.sub.j, where j ranges from 1 to a maximum number, and where T.sub.(j+1) is larger than T.sub.j. In the preferred embodiment of the invention, four increasing timeout values are predetermined, namely T1=100 nanoseconds (ns), T2=200 ns, T3=400 ns, and T4=Tmax=1000 ns.

In the step 906 "Reset Error Latches", the logic circuit 544 activates the RESET signal to reset the SR latches 582 and 584 in the differential advanced and delayed error detection circuit 542. This causes the ERRa and ERRd logic signals to become logical "0" or "LOW".

During the step 908 "Wait T.out", the Logic Circuit waits for a time period of T.out (e.g. 100 ns), while the differential advanced and delayed error detection circuit 542 continues to sample the data signal. In the case where T.out=100 ns and the data rate is 10 Gb/s, approximately 1000 data bits are sampled during the period of the step 908 "Wait T.out". Any errors detected by the differential advanced and delayed error detection circuit 542 are latched in the SR latches 582 and 584. That is, if no errors are detected, the ERRa and ERRd logic signals remain "LOW", but if one or more of the advanced and delayed errors are detected, the corresponding error signals (ERRa and ERRd respectively) are latched as logical "1" or "HIGH".

At the end of the step 908 "Wait T.out", the latched states of the ERRa and ERRd logic signals are evaluated. In the step 910 "ERRa=ERRd?", a determination is made whether the values of ERRa and ERRd are either both low or both high, i.e. whether they are equal. If they are equal (branch "yes"), then the decision step 914 "T.out >=Tmax" is performed.

In the step 914 "T.out >=Tmax", a determination is made whether T.out has reached the last of the predetermined timeout values (Tmax). If Tmax has been reached, then the algorithm proceeds to "END", otherwise the step 916 "Increase T.out" is performed.

In the step 916 "Increase T.out", the value of T.out is increased to the next higher timeout value T.sub.j, up to Tmax, and the algorithm goes back to the step 906 "Reset Error Latches".

If ERRa and ERRd are not equal, one or the other of the latched error signals ERRa and ERRd must be "HIGH" and the other "LOW". Following the "no" branch from the step 910 "ERRa=ERRd?", the algorithm proceeds to the comparison step 912 "ERRa=HIGH?".

If ERRa=HIGH (branch "yes"), indicating that an error was recorded at the advanced sampling position "A" and the present sampling edge position is (probably) to the left of the optimum, the step 918 "Increase ASG by 1" is performed.

In the step 918 "Increase ASG by 1", the Logic Circuit 544 updates the register 588 of the ASG 546 to increase its value by 1 unless the register is at the end of it's positive range. This will result in a shift of the sampling edge position to the right by a small amount "d", "d" being a small fraction of the clock period. After performing the step 918 the algorithm proceeds to "END".

If ERRa is not HIGH (branch "no" from the comparison step 912 "ERRa=HIGH?"), this implies that ERRd must be HIGH, indicating that the present sampling edge position is to the right of the optimum, the step 920 "Decrease ASG by 1" is performed.

In the step 920 "Decrease ASG by 1", the Logic Circuit 544 updates the register 588 of the ASG 546 to decrease its value by 1 unless the register is at the end of it's negative range. This will result in a shift of the sampling edge position to the left by the small amount "d". After performing the step 920 the algorithm proceeds to "END".

In the preferred embodiment of the invention, based on a 10 Gb/s data rate, and a 7-bit ASG, the small amount "d" is approximately 0.5 ps. As a result, an accurate control of the sampling edge position in the 100 ps wide data eye is possible.

Figure 10:
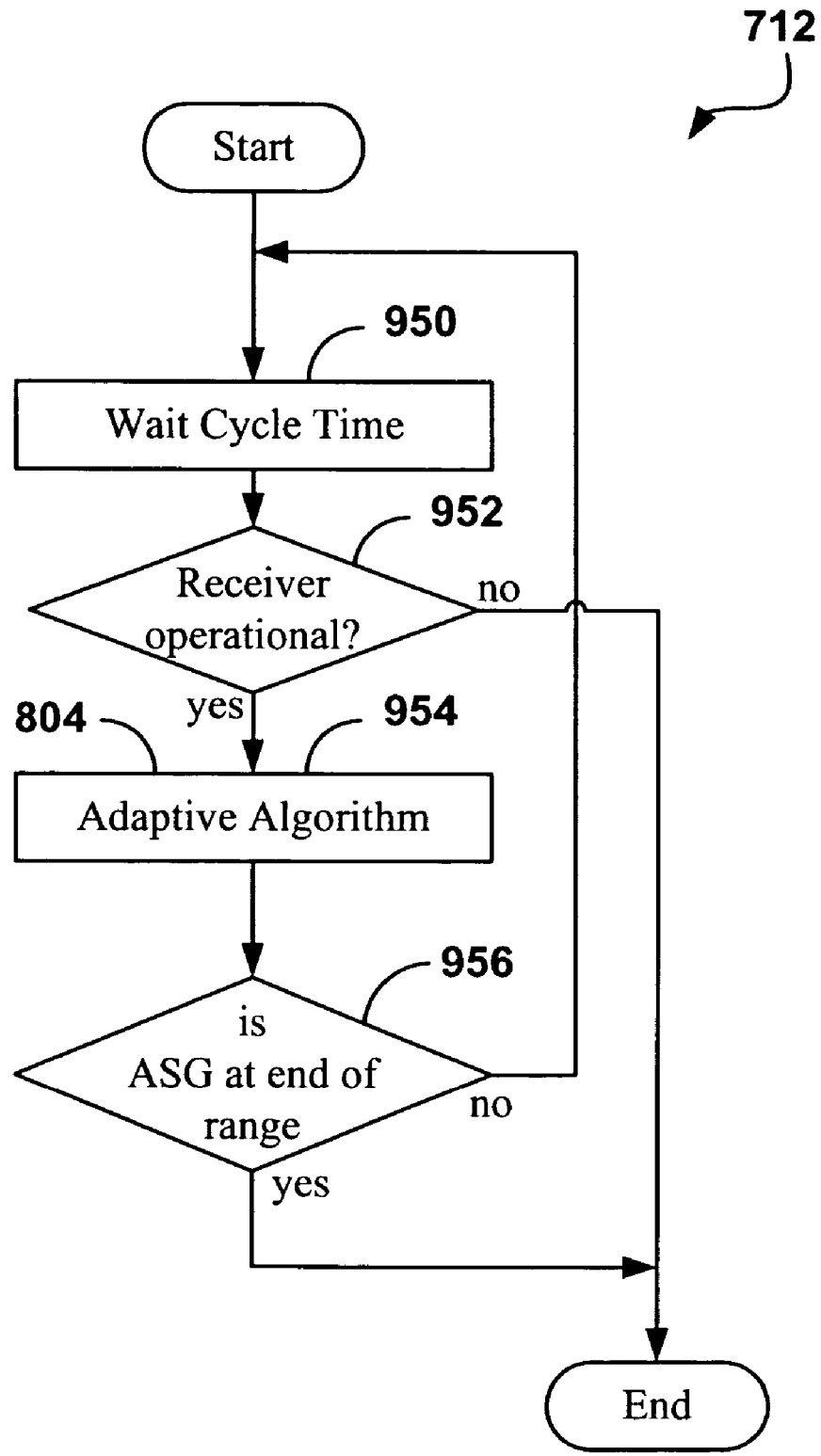
FIG. 10 shows a detailed flow chart of the step 712 "Phase Offset Adaptation" of the method of FIG. 7.

FIG. 10 shows an expanded flow chart of the step 712 "Phase Offset Adaptation", which includes the following steps:
950 "Wait Cycle Time";
952 "Is Receiver Operational?";
954 "Adaptive Algorithm"; and
956 "is ASG at end of range?".

The step 712 "Phase Offset Adaptation" includes a loop of the four steps 950, 952, 954 and 956, performed in sequence for as long as the condition tested in the step 956 "is ASG at end of range?" remains false. The purpose of the step 712 "Phase Offset Adaptation" is to maintain the near optimum sampling edge position by performing the step 954 "Adaptive Algorithm" repeatedly. The step 954 "Adaptive Algorithm" is identical to the step 804 "Adaptive Algorithm" described above.

The step 950 "Wait Cycle Time" serves to control the speed of adaptation. In the preferred embodiment, a cycle time in the range of about a few milliseconds to about few seconds is used. The value of the cycle time was set in the step 711 "Set Cycle Time" of FIG. 7 above.

The step 952 "Is Receiver Operational?" is similar to the step 706 "is Receiver Operational?" above, and serves to confirm the continued reception of the data signal, by conventional. If the receiver is operational ("yes" branch of the step 952 "Is Receiver Operational?"), processing of the step 954 "Adaptive Algorithm" occurs once, followed by the range check (step 956).

In the step 956 "is ASG at end of range?", a determination is made if the analog signal generator (ASG) 546 has reached the end of its range. If the result is true ("yes" branch) the step 712 ends, otherwise the loop is continued and, after the cycle time delay (step 950), and the receiver-operational check (step 952), the adaptive algorithm (step 954) is run again, and so on.

If the signal appears to have failed ("no" branch from the step 952 "Is Receiver Operational?"), the step 712 "Phase Offset Adaptation" ends, until such time as the signal may be reacquired (see FIG. 7).

The initial choice of the value of T.out (100 ns in the preferred embodiment), and the subsequent increases of the value of T.out (up to 1000 ns in the preferred embodiment) are designed to allow for fast conversion of the algorithm during the phase acquisition period (the step 708 "Phase Offset Acquire"), in which the "Adaptive Algorithm", step 954 is applied repeatedly without delay.

Once the system is in the phase adaptation mode (the step 712 "Phase Offset Adaptation"), no or few error events (error signals ERRa or ERRd going HIGH) are expected unless there is a significant change in the data patterns (leading to different eye degradation), or a temperature change causing a circuit drift. These changes are tracked by the repeated application of the "Adaptive Algorithm", step 954, but at a lower repetition rate, as determined by the delay step 950 "Wait Cycle Time".

Conclusion

In using the Differential Sampling Edge Position Control Circuit 522 of the embodiment of the invention in combination with a Clock and Data Recovery having phase offset control, there is provided a simple adaptive method for decoding high speed signals, such as those of 10 and 40 Gbps fiber optic links, in the presence of signal eye degradation.

Although the present invention has been described as an enhancement of the Phase Adjustable Clock Recovery circuit 400 of the receiver circuit 100 of the copending application, it will be readily apparent to persons skilled in the art that it may also be used to enhance the performance of other high speed Clock and Data Recovery (CDR) schemes.

Although the embodiment of the invention has been described in detail, it will be apparent to one skilled in the art that variations and modifications to the embodiment may be made within the scope of the following claims.

What is claimed is:

1. A method for controlling a sampling edge position in a clock and data recovery (CDR) circuit, the CDR having a phase offset control circuit for adjusting the sampling edge position, the CDR receiving a high speed data signal, the method comprising:
   (a) generating one or more error signals from the received high speed data signal, comprising:
      (i) sampling the high speed data signal with each of an advanced, current and delayed clock signal to generate advanced, current and delayed sampled data signals;
      (ii) comparing the advanced and delayed sampled data signals with the current sampled data signal to generate respective advanced and delayed error signals;
   (b) prior to processing the error signals, recording in a memory the occurrence of the first of each of the advanced and delayed error signals during a selected time interval;
   (c) processing the generated advanced and delayed error signals to generate a phase offset control signal to adjust the sampling edge position in the CDR; and
   wherein the step (c) comprises:
      (iii) setting a selected time interval (T.out) to a predetermined time interval;
      (iv) clearing the memory and waiting for the selected time interval to expire;
      (v) if the advanced and delayed error signals are not equal, adjusting the sampling edge position by a fraction of the clock period; and
      (vi) if the advanced and delayed error signals are equal, changing the selected time interval to another longer predetermined time interval, and repeating the steps (iv) to (vi) until the selected time interval reaches its maximum value (Tmax).

2. A method as described in 1, further comprising a step (d) of repeating the steps (a) to (c) as long as the high speed data signal is being received.

3. A method as described in 2, wherein the step (d) comprises repeating the steps (a) to (c) until the advanced and delayed error signals are equal.

4. A method as described in claim 2, wherein the step (d) comprises repeating the steps (a) to (c) after waiting a predetermined Cycle time.

5. A method as described in claim 3, wherein the step (d) comprises terminating the step (d) when the phase offset control signal reaches the end of its range.

6. A method as described in claim 4, wherein the step (d) comprises terminating the step (d) of repeating when the phase offset control signal reaches the end of its range.

7. A method for adapting a sampling edge position in a clock and data recovery (CDR) circuit receiving a high speed data signal, the CDR having a phase offset control circuit, the method comprising the steps of:
   (a) setting a sampling edge position by setting a clock phase offset through the phase offset control circuit;
   (b) setting a Cycle Time time interval equal to zero;
   (c) adapting said sampling edge position, comprising the steps of:
      (i) waiting for a time period equal to the Cycle Time time interval;
      (ii) sampling the high speed data signal with each of the advanced, current and delayed clock signals to generate advanced, current and delayed sampled data signals;
      (iii) comparing the advanced and delayed sampled data signals with the current sampled data signal to generate respective advanced and delayed error signals;
      (iv) recording in a memory the occurrence of the first of each of the advanced and delayed error signals during a selected time interval and adjusting the clock phase offset in response to the recorded error signals;
      (v) changing the Cycle Time time interval to a positive value if the Cycle Time time interval is equal to zero, and the advanced and delayed error signals are equal;
      (vi) setting the selected time interval to a predetermined time interval;
      (vii) clearing the memory and waiting for the selected time interval to expire;
      (viii) if the advanced and delayed error signals are equal, changing the selected time interval to another longer predetermined time interval, and repeating the steps (vii) to (viii) a number of times, otherwise adjusting the clock phase offset by a fraction of the clock period; and
   (d) repeating the step (c) as long as the high speed data signal is present and within a CDR range.

* * * * *